United States Patent
Dozaka

(10) Patent No.: US 10,546,630 B2
(45) Date of Patent: Jan. 28, 2020

(54) SEMICONDUCTOR MEMORY DEVICE AND CONTROL METHOD OF SEMICONDUCTOR MEMORY DEVICE

(71) Applicants: KABUSHIKI KAISHA TOSHIBA, Minato-ku (JP); Toshiba Electronic Devices & Storage Corporation, Minato-ku (JP)

(72) Inventor: Toshiaki Dozaka, Yokohama (JP)

(73) Assignees: KABUSHIKI KAISHA TOSHIBA, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 16/127,784

(22) Filed: Sep. 11, 2018

(65) Prior Publication Data

US 2019/0287606 A1 Sep. 19, 2019

(30) Foreign Application Priority Data

Mar. 19, 2018 (JP) ................................ 2018-051546

(51) Int. Cl.
| | |
|---|---|
| *G11C 11/4094* | (2006.01) |
| *G11C 11/4097* | (2006.01) |
| *G11C 11/4076* | (2006.01) |
| *G11C 11/4093* | (2006.01) |
| *G11C 11/4096* | (2006.01) |
| *G11C 11/4091* | (2006.01) |

(52) U.S. Cl.
CPC ...... *G11C 11/4094* (2013.01); *G11C 11/4076* (2013.01); *G11C 11/4091* (2013.01); *G11C 11/4093* (2013.01); *G11C 11/4096* (2013.01); *G11C 11/4097* (2013.01)

(58) Field of Classification Search
CPC ............ G11C 11/4094; G11C 11/4076; G11C 11/4091; G11C 11/4093; G11C 11/4096; G11C 11/4097
USPC ........................................................ 365/174
See application file for complete search history.

(56) References Cited

U.S. PATENT DOCUMENTS

| | | |
|---|---|---|
| 8,335,120 B2 | 12/2012 | Shinohara |
| 8,797,786 B2 | 8/2014 | Moriwaki |
| 8,917,567 B2 | 12/2014 | Takayama et al. |

(Continued)

FOREIGN PATENT DOCUMENTS

| | | |
|---|---|---|
| JP | 2010-170641 | 8/2010 |
| JP | 2011-258276 | 12/2011 |

(Continued)

*Primary Examiner* — Fernando Hidalgo
(74) *Attorney, Agent, or Firm* — Oblon, McClelland, Maier & Neustadt, L.L.P.

(57) ABSTRACT

According to an embodiment, there is provided a semiconductor memory device comprising: a global bit line; a local bit line to which a plurality of cell transistors are connected; a switch connected to the local bit line; signal lines connected to the plurality of cell transistors; and a control circuit, wherein the control circuit selects a cell transistor to be selected by setting a potential of the signal line of the cell transistor to be selected to a first potential, changes a potential of the global bit line, changes a potential of the local bit line, and turns on the switch to connect the local bit line to the global bit line after changing the potential of the global bit line and the potential of the local bit line.

19 Claims, 8 Drawing Sheets

(56) References Cited

U.S. PATENT DOCUMENTS 8,971,139 B2 3/2015 Kajigaya
2017/0358334 A1* 12/2017 Onuki .................. G11C 7/1018

FOREIGN PATENT DOCUMENTS

JP 2012-123878 6/2012
JP 5505274 5/2014

* cited by examiner

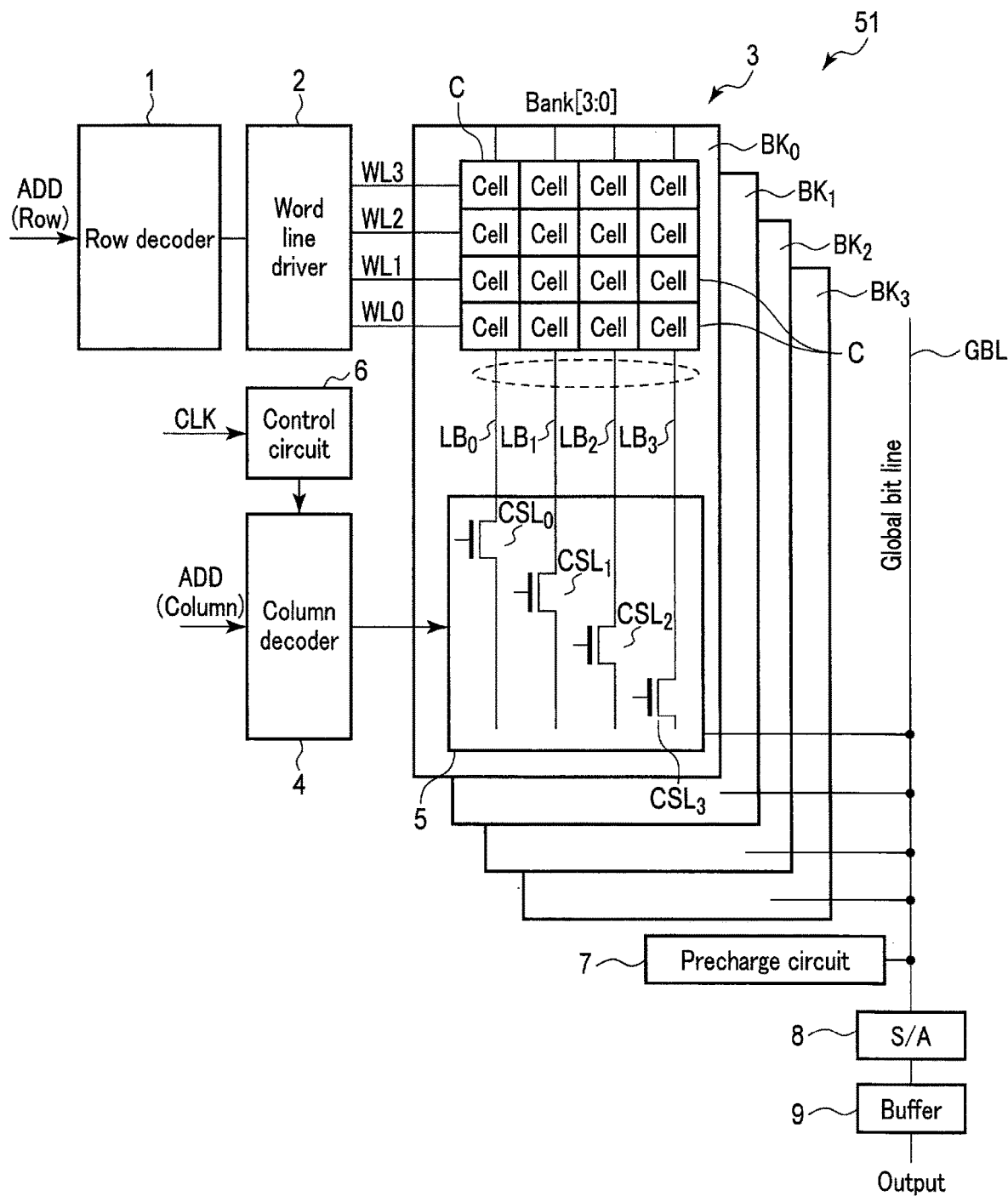
F I G. 1

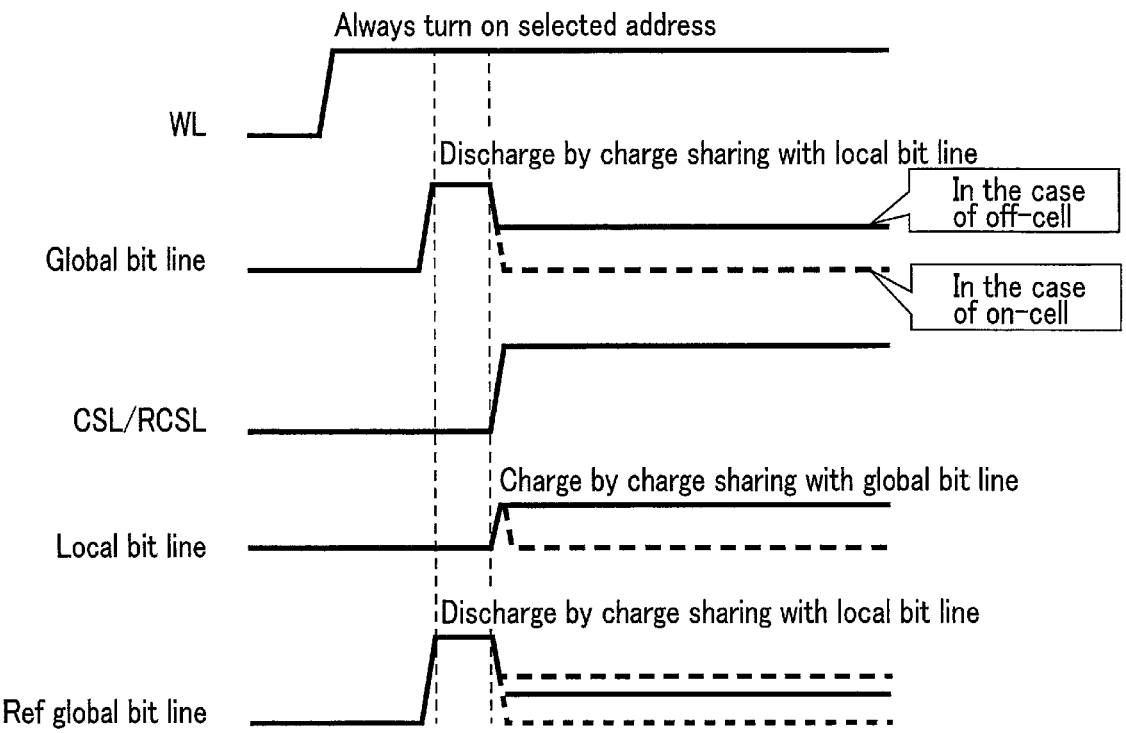
F I G. 7
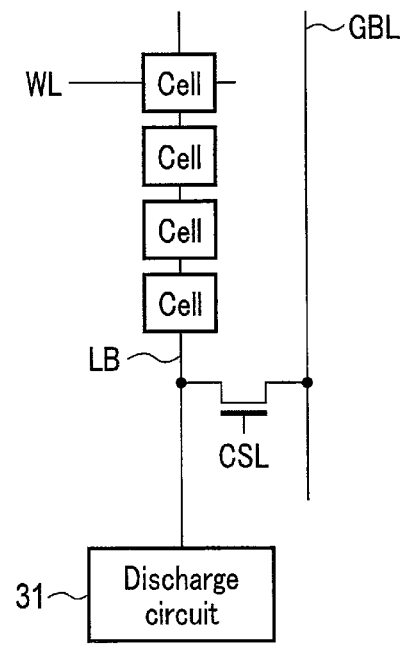
F I G. 8

US 10,546,630 B2

SEMICONDUCTOR MEMORY DEVICE AND CONTROL METHOD OF SEMICONDUCTOR MEMORY DEVICE

CROSS-REFERENCE TO RELATED APPLICATION

This application is based upon and claims the benefit of priority from Japanese Patent Applications No. 2018-051546, filed Mar. 19, 2018; the entire content which is incorporated herein by reference.

FIELD

Embodiments described herein relate generally to a semiconductor memory device and a control method of the semiconductor memory device.

BACKGROUND

Some semiconductor memory devices adopt a hierarchical structure having a global bit line and a local bit line due to a reading speed and also to prevent an erroneous operation caused by cell leakage.

In such a semiconductor memory device, charging and discharging occurs in both the local bit line and the global bit line when reading data, leading to large power consumption.

Also, the reading speed of data depends on the cell current and there is a problem that the reading speed is slow. Further, there are circuits other than the cells (a precharge/discharge circuit, a column selector, S/A (sense amplifier), and a buffer) for each bank, which increases the area of the bank.

BRIEF DESCRIPTION OF THE DRAWING(S)

FIG. 1 is a block diagram of a mask ROM 51 as a semiconductor memory device according to an embodiment;

FIG. 7 is a timing chart illustrating a charge sharing operation of a semiconductor memory device including the reference local bit line RLBL shown in FIG. 6 and a reference global bit line RGBL;

FIG. 8 is a diagram showing an example in which a discharge circuit 31 is connected to a local bit line LB to which four memory cells C are connected;

Figure 11:
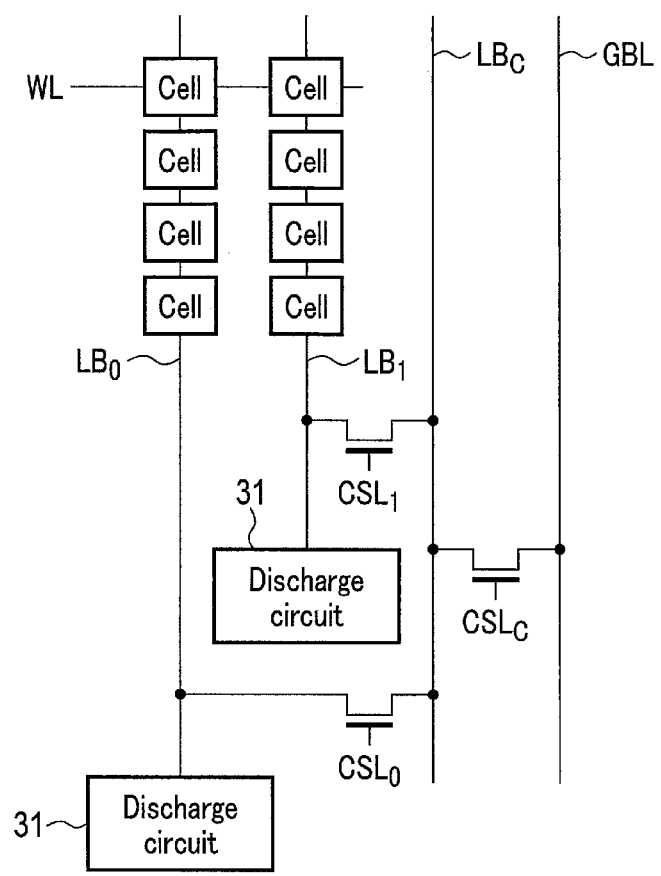
Figure 12:
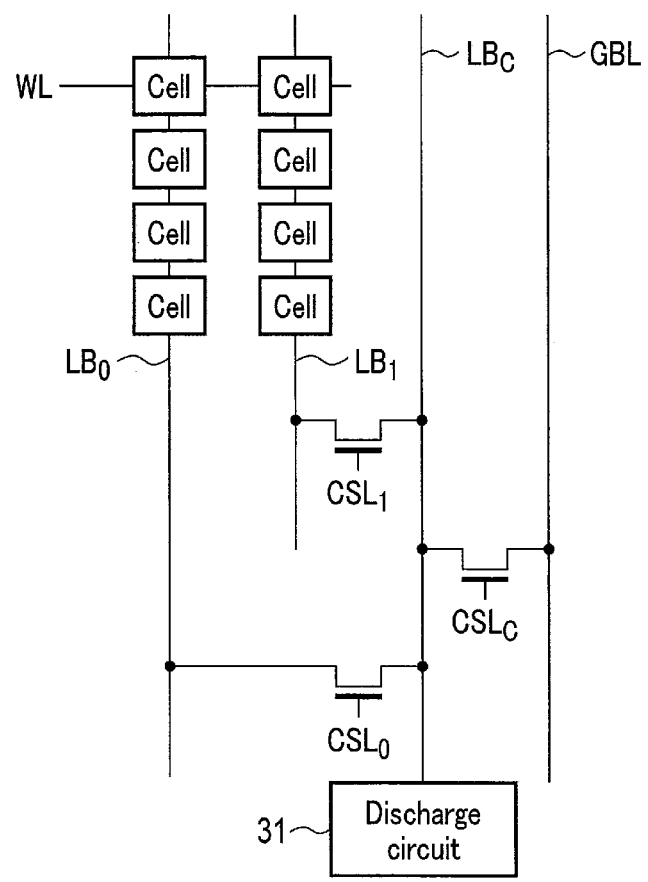

FIG. 11 is a diagram showing an example in which local bit lines LB to which the discharge circuit 31 is connected are collectively connected to a common local bit line $LB_C$ before being connected to the global bit line GBL; and FIG. 12 is a diagram showing an example in which two discharge circuits 31 shown in FIG. 11 are shared by a single discharge circuit 31.

DETAILED DESCRIPTION

According to an embodiment, there is provided a semiconductor memory device comprising: a global bit line; a local bit line to which a plurality of cell transistors are connected; a switch connected to the local bit line; signal lines connected to the plurality of cell transistors; and a control circuit, wherein the control circuit selects a cell transistor to be selected by setting a potential of the signal line of the cell transistor to be selected to a first potential, changes a potential of the global bit line, changes a potential of the local bit line, and turns on the switch to connect the local bit line to the global bit line after changing the potential of the global bit line and the potential of the local bit line.

Hereinafter, an embodiment will be described with reference to the drawings. In the description that follows, the same reference signs are attached to components having substantially the same function and configuration and a duplicate description is provided only when necessary. Each embodiment shown below exemplifies an apparatus or a method of embodying technical ideas of the present embodiment and technical ideas of an embodiment do not limit the materials, shapes, structures, arrangements and the like of components to those described below. Technical ideas of an embodiment can be modified in various ways in claims.

Each functional block can be implemented as either hardware or computer software, or a combination of both. For this reason, each block will be described below generally in terms of its function, so that it becomes clear how the block is implemented. Whether such a function is executed as hardware or software depends on the specific implementation or design constraints imposed on the overall system. Those skilled in the art can implement these functions in various ways for each specific embodiment, but determining such implementation is included within the scope of the present invention.

When it is not necessary to distinguish and describe the constituent elements in an embodiment, a description will be given by omitting reference signs. For example, when it is not necessary to distinguish and describe the word lines WL0, WL1, WL2, WL3, the "word line WL" will be described by omitting the reference signs. The same applies to other components.

(1) Configuration

FIG. 1 is a block diagram of the mask ROM 51 as a semiconductor memory device according to an embodiment.

As shown in FIG. 1, the mask ROM (Read Only Memory) 51 according to an embodiment includes a row decoder 1, a word line driver 2, a memory cell array 3, a column decoder 4, a column switch 5 of the memory cell array 3, a control circuit 6, a precharge circuit 7, a sense amplifier (S/A) 8, and a buffer 9.

The row decoder 1 receives a row address section of an address signal and supplies a word line selection signal for a corresponding bank of the memory cell array 3 to the word line driver 2. The word line driver 2 applies a row selection signal (H active) to the word line WL corresponding to the word line selection signal. Note that the selection of the word line W may be made asynchronously with a synchronization signal on which the semiconductor memory device operates.

The column decoder 4 receives a column address section of an address signal and applies a column selection signal for the corresponding bank of the memory cell array 3 to the column switch 5.

The memory cell array 3 has four banks $BK_0$ to $BK_3$. The number of banks BK is not limited to four. The bank $BK_0$ includes four memory cells C connected to a local bit line $LB_0$ and selected by the local bit line $LB_0$ and word lines $WL_0$ to $WL_3$, four memory cells C connected to a local bit line $LB_1$ and selected by the local bit line $LB_1$ and the word lines $WL_0$ to $WL_3$, four memory cells C connected to a local bit line $LB_2$ and selected by the local bit line $LB_2$ and the word lines $WL_0$ to $WL_3$, and four memory cells C connected to a local bit line $LB_3$ and selected by the local bit line $LB_3$ and the word lines $WL_0$ to $WL_3$, The other banks $BK_1$ to $BK_3$ have the same configuration.

The memory cell C has a cell transistor and is selected by the word line WL and the local bit line LB.

The column switch 5 has a column selection switch CSL connected to each of the local bit lines LB and connects the local bit line LB of the memory cell C selected by the word line driver 2 to the global bit line GBL in response to a column selection signal from the column decoder 4. The bank $Bk_0$ has column selection switches $CSL_0$ to $CSL_3$ connected to the local bit lines $LB_0$ to $LB_3$ respectively and connects the local bit line LB of the local memory cell C selected by the word line driver 2 to the global bit line GBL in response to a column selection signal from the column decoder 4.

When the selected memory cell C is read, read data from the memory cell C is output via the column selection switch CSL selected by a column selection signal, the global bit line GBL, the sense amplifier (S/A) 8, and the buffer 9.

Based on a clock CLK and a control signal CTL supplied from outside, the control circuit 6 controls each unit (such as the local bit line LB, the global bit line GBL, the word line driver 2, the column decoder 4, the precharge circuit 7, etc.) of the mask ROM 51. The control signal includes, for example, a read signal RE.

The precharge circuit 7 precharges the global bit line GBL and a reference global bit line RGBL described below.

The sense amplifier (S/A) 8 compares the voltage read out from the selected memory cell C via the local bit line LB, the column selection switch CSL, and the global bit line GBL with the reference voltage, determines a data value, and amplifies the determined data value before storing the data value in the buffer 9.

The buffer 9 stores and outputs the data value determined by the sense amplifier 8.

(2) Operation of the Semiconductor Memory Device According to an Embodiment

Next, a charge sharing operation of the semiconductor memory device according to an embodiment will be described.

Figure 2:
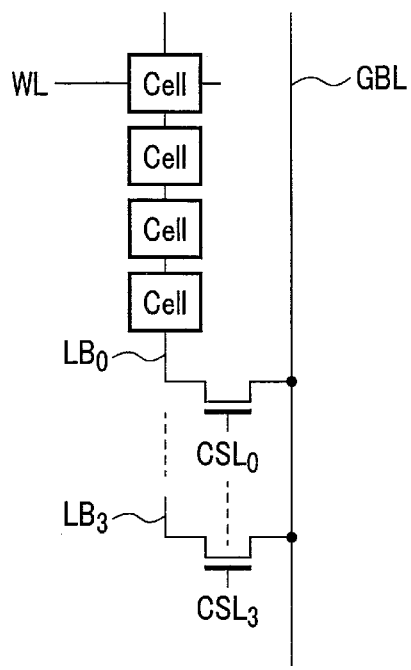
FIG. 2 is a diagram showing a relationship between local bit lines $LB_0$ to $LB_3$ to which four memory cells C are connected in a bank $BK_0$ and a global bit line GBL.

FIG. 2 is a diagram showing the relationship between the local bit lines $LB_0$ to $LB_3$ to which the four memory cells C are connected in the bank $BK_0$ and the global bit line GBL. As shown in FIG. 2, the local bit lines $LB_0$ to $LB_3$ are connected to the global bit line GBL via the column selection switches $CSL_0$ to $CSL_3$.

Figure 3:
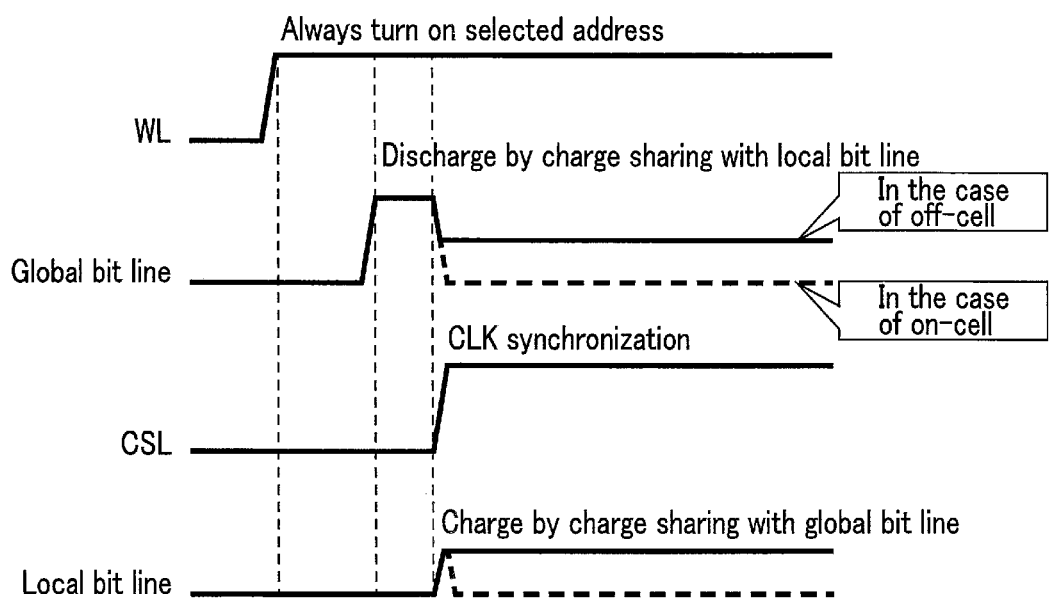
FIG. 3 is a timing chart illustrating a charge sharing operation of the semiconductor memory device according to an embodiment shown in FIG. 1.

FIG. 3 is a timing chart illustrating a charge sharing operation of the semiconductor memory device according to an embodiment shown in FIG. 1.

As shown in FIG. 3, the word line WL of the selected address is first turned on. The timing of turning on the word line WL may be synchronized with the clock of the semiconductor memory device or may be asynchronous.

Then, after charging the global bit line GBL, the column selection switch CSL selected is turned on in synchronization with the clock.

Accordingly, when the selected memory cell C is an off-cell, the potential of the global bit line GBL falls by charges of the global bit line. GBL being charge-shared with the local bit line LB. The potential of the local bit line LB rises by being charge-shared with the global bit line GBL.

The control circuit 6 may set a potential of the local bit line LB of the selected address to an initial potential which is different from an initial potential (for example, the ground potential) of the global bit line GBL before the column selection switch CSL selected is turned on. For, example, a timing of setting the potential of the local bit line LB of the selected address to the initial potential is between a timing of turning on the column selection switch CSL selected and a timing of setting the potential of the global bit line GBL.

When the selected memory cell C is an on-cell, the potential of the global bit line GBL falls to the potential (for example, the ground potential) while the selected memory cell C is an on-cell when the column selection switch CSL is turned on. When the column selection switch CSL is turned on, the potential of the local bit line LB rises instantaneously because the potential of the global bit line is in the on state, but then falls to the potential in the case of an on-cell.

(3) Effect (3-1) Comparative Example

Figure 4:
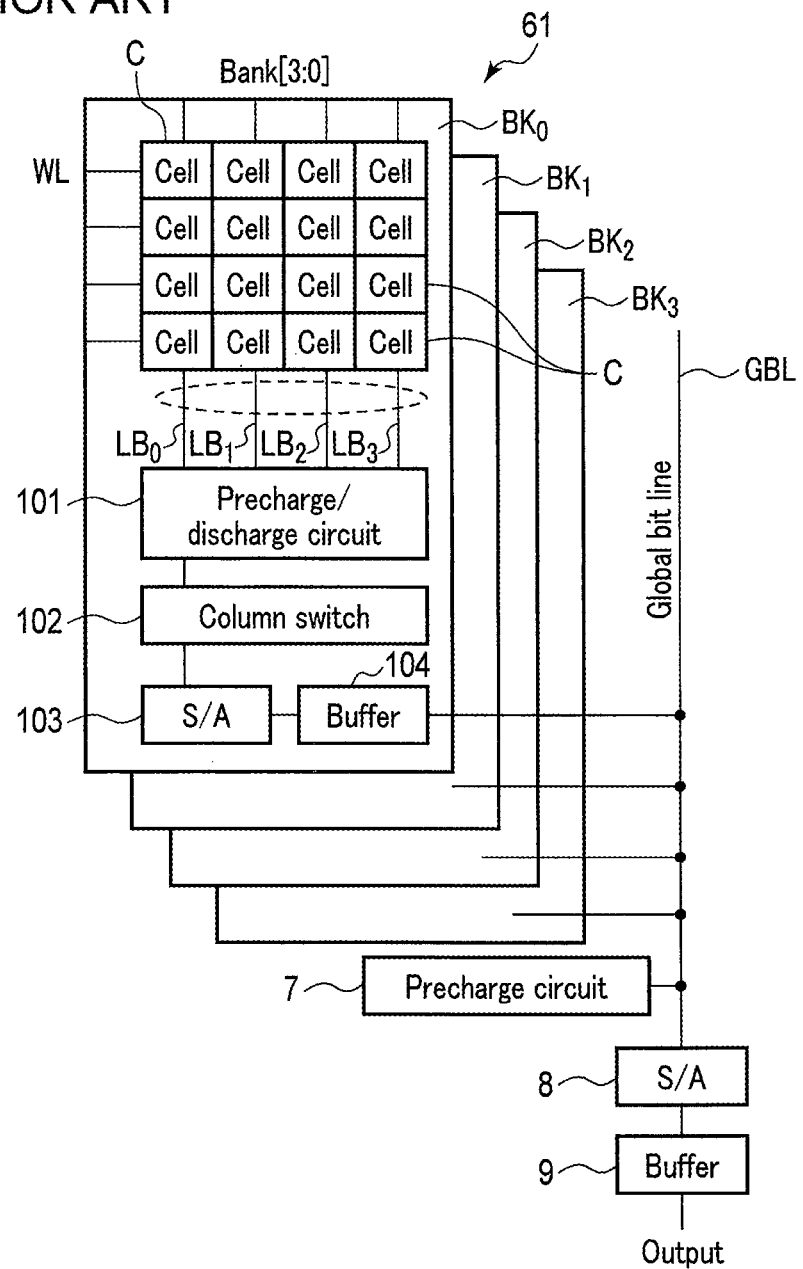
FIG. 4 is a block diagram of a mask ROM 61 as a comparative example.

FIG. 4 is a block diagram of the mask ROM 61 as a comparative example. The same units as those in FIG. 1 are denoted with the same reference signs, and a description thereof will be omitted here. As shown in FIG. 4, the mask ROM 51 differs from the mask ROM 51 shown in FIG. 1 in that each bank $BK_0$ to $BK_3$ of the memory cell array 3 has a precharge/discharge circuit 101, a column switch 102, a sense amplifier 103, and a buffer 104.

The precharge/discharge circuit 101 is a circuit for precharging and discharging the local bit line LB.

The column switch 102 selects the local bit line LB of the memory cell array 3.

The sense amplifier (S/A) 103 compares the voltage read from the selected memory cell C via the local bit line LB with the reference voltage to determine the data value and amplifies the determined data value before storing the data value in the buffer 104.

The buffer 104 outputs the determined data value from the sense amplifier (S/A) 103 to the global bit line GBL.

Figure 5:
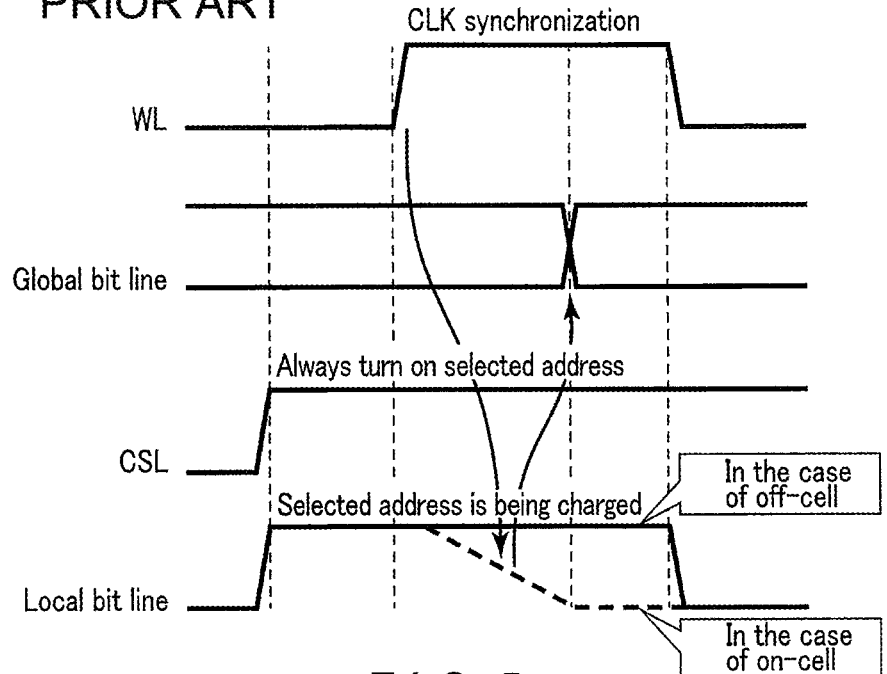
FIG. 5 is a timing chart illustrating a read operation of the mask ROM 61 as a comparative example shown in FIG. 4.

FIG. 5 is a timing chart illustrating a read operation of the mask ROM 61 as a comparative example shown in FIG. 4.

As shown in FIG. 5, the selected local bit line LB is charged and also the selected column switch 102 is turned on. Then, the selected word line WL is turned on in synchronization with the clock.

Accordingly, when the selected memory cell C is an on-cell, the memory cell C of the selected local bit line LB is discharged, and the potential of the selected local bit line LB gradually falls. On the other hand, when the memory cell C of the selected local bit line is an off-cell, the potential of the local bit line LB is maintained until the word line selection signal turns off.

The sense amplifier 103 compares the voltage read from the selected memory cell C via the local bit line LB with the reference voltage to determine the data value and amplifies the determined data value before storing the data value in the buffer 104. The determined data value is output from the buffer 104 to the global bit line GBL.

The sense amplifier 8 senses the potential of the global bit line GBL, brings the potential of the global bit line GBL into an on state or an off state, and outputs the potential to the buffer 9.

That is, in the comparative example, charging and discharging occurs in both the local bit line LB and the global bit line GBL when reading data, leading to large power consumption. In addition, the reading speed of data depends on the cell current of the memory cell C and so the reading speed of data slows down. Further, for each bank Bk, the precharge/discharge circuit 101, the column switch 102, the sense amplifier 103, and the buffer 104 other than the memory cell C are present, increasing the area.

(3-2) Effects of Semiconductor Memory Device According to Embodiment

According to the semiconductor memory device in an embodiment, the power consumption when data is read is only for charging/discharging the global bit line GBL, which can reduce the power consumption. In addition, the reading speed of data depends on the column selection switch CSL and thus, as compared with the case of having other circuits (the precharge/discharge circuit 101, the column switch 102, the sense amplifier 103, and the buffer 104) in the bank Bk, the reading speed of data can be improved and also, the area of the semiconductor memory device can be reduced.

(4) Modifications

(4-1) First Modification

Figure 6:
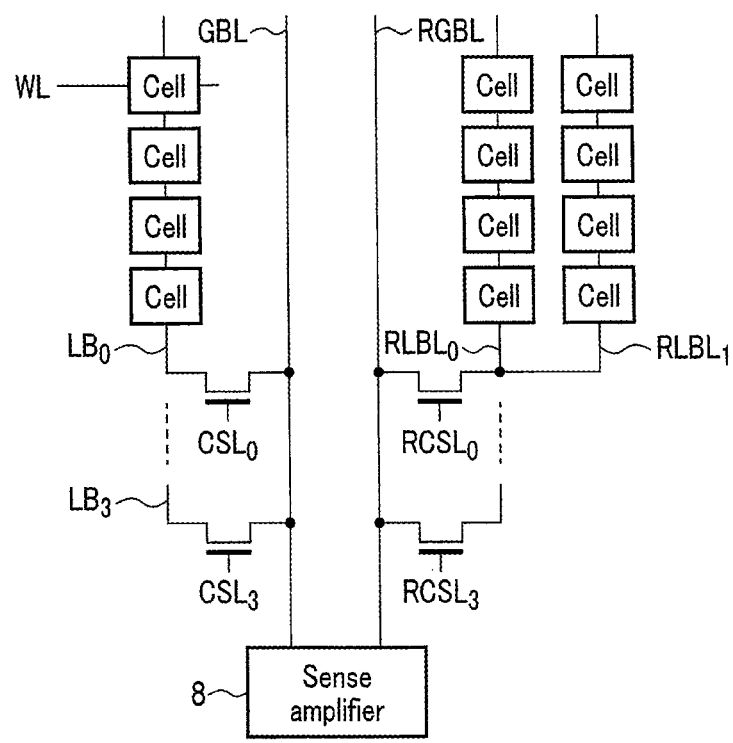
FIG. 6 is a diagram showing a relationship between the global bit line GBL and a reference local bit line RLBL connected to a sense amplifier 8.

FIG. 6 is a diagram showing the relationship between the global bit line GBL connected to the sense amplifier 8 and the reference local bit line RLBL.

In FIG. 6, the local bit lines $LB_0$ to $LB_3$ to which four memory cells C are connected, the global bit line GBL, two reference local bit lines $RLBL_0$, $RLBL_1$, and the reference global bit line RGBL in bank $BK_0$ are shown.

As shown in FIG. 6, the local bit lines $LB_0$ to $LB_3$ to which the four memory cells C are connected respectively are connected to the global bit line GBL via the column selection switches $CSL_0$ to $CSL_3$.

The two reference local bit lines $RLBL_0$, $RLBL_1$ to which four memory cells C are connected are connected to the reference global bit line RGBL via reference voltage selection switches $RCSL_0$ to $RCSL_3$.

That is, the number of cell transistors of the memory cell C connected to reference local bit line RLBL is larger than the number of cell transistors of the memory cell C connected to the local bit line $LB_0$.

The number of cell transistors connected to the local bit line LB is the number of cell transistors in accordance with data to be memorized. In contrast, the number of cell transistors connected to the reference local bit line RLBL is a unique. The number of cell transistors connected to the reference local bit line RLBL may be changed in accordance with a connection condition of the cell transistors electrically connected to the local bit line LB.

Column selection signals supplied to the column selection switches $CSL_0$ to $CSL_3$ are supplied to the reference voltage selection switches $RCSL_0$ to $RCSL_3$ respectively. When the column selection signal is supplied to the selected reference voltage selection switch RCSL, the two reference local bit lines $RLBL_0$, $RLBL_1$ are connected to the reference global bit line RGBL.

Accordingly, when the selected memory cell C is read, the read data from the memory cell C is input into the sense amplifier (S/A) 8 via the column selection switch CSL selected by the column selection signal and the global bit line GBL.

The reference voltage obtained by the four memory cells C connected to the reference local bit line $RLBL_0$ and the four memory cells C connected to the reference local bit line $RLBL_1$ is input into the sense amplifier (S/A) 8 via the reference voltage selection switch RCSL and the reference global bit line RGBL.

The sense amplifier 8 compares the potential of the selected memory cell C input via the global bit line GBL with the reference voltage input via the reference global bit line RGBL to determine the data value and amplifies the determined data value before storing the data value in the buffer 9.

The value of the memory cell C connected to the local bit line LB and the reference local bit line RLBL is determined in the fabrication process of the mask ROM according to an embodiment. For example, the memory cell C connected to the reference local bit line RLBL is formed of an off-cell having via.

The reference voltage obtained from the four memory cells C (total of eight memory cells C) connected to each of the reference local bit lines $RLBL_0$, $RLBL_1$ is designed so as to be an intermediate voltage between a voltage when the selected memory cell C is on and a voltage when the selected memory cell C is off.

It should be noted that the reference voltage selection switches $RCSL_0$ to $RCSL_3$ and the column selection switches $CSL_0$ to $CSL_3$ may be the same signal line.

The number of the reference voltage selection switches $RCSL_0$ to $RCSL_3$ may be one (for example, only $RCSL_0$). Even with such a configuration, the reference voltage can be supplied to the sense amplifier 8 when the memory cell C is selected.

Further, the present example has been described as a case where the number of reference local bit lines RLBL is two, but three or more reference local bit lines RLBL may be used.

FIG. 7 is a timing chart illustrating the charge sharing operation of the semiconductor memory device including the reference local bit line RLBL shown in FIG. 6 and the reference global bit line RGBL.

The control of the word line WL, the global bit line GBL, the column selection switch CSL, and the local bit line LB is the same as the control described with reference to FIG. 3. That is, the word line WL of the selected address is turned on, then the global bit line GBL is turned on, and then the column selection switch CSL selected in synchronization with the clock is turned on.

Note that the selection of the word line W may be made asynchronously with a synchronization signal on which the semiconductor memory device operates.

Accordingly, when the selected memory cell C is an off-cell, the potential of the global bit line GBL instantaneously falls by charges of the global bit line GBL being charge-shared with the local bit line LB. The potential of the local bit line LB rises by being charge-shared with the global bit line GBL.

When the selected memory cell C is an on-cell, the potential of the global bit line GBL falls to the potential (for example, the ground potential) while the selected memory cell C is an on-cell when the column selection switch CSL is turned on. When the column selection switch CSL is turned on, the potential of the local bit line LB rises instantaneously because the potential of the global bit line is in the on state, but then falls to the potential in the case of an on-cell.

Further, the potential of the reference global bit line. RGBL is turned on at the same timing as the timing at which the potential of the global bit line GBL is charged. Then, the corresponding reference column selection switch RCSL is turned on at the same timing as the timing at which the column selection switch CSL selected in synchronization with the clock is turned on.

Accordingly, the reference voltage of the memory cell C connected to the reference local bit line RLBL appears on the reference global bit line RGBL and is supplied to the sense amplifier 8. The reference voltage is set so as to be an intermediate voltage between a voltage when the memory cell C connected to the local bit line LB is in an off state and a voltage when the memory cell C is in an on state.

Note that the reference voltage may be generated by a regulator or a resistance dividing circuit.

Further, reading of data by the sense amplifier 8 may be performed independently of external timing.

In addition, even if an off-cell having via or an on-cell having no via is used for the memory cell C connected to the reference local bit line RLBL and read control of data as described in an embodiment is exercised, an on/off range (for example, 50 mV or more) in which the sense amplifier 8 normally operates can be secured.

(4-2) Second Modification (Example of Arrangement of Discharge Circuit)

The second modification shows the arrangement of the discharge circuit 31 for discharging the memory cell C connected to the local bit line LB of the mask ROM 51 according to an embodiment.

FIG. 8 is a diagram showing an example in which the discharge circuit 31 is connected to the local bit line LB to which four memory cells C are connected. The selected memory cell C is connected to the global bit line GBL via the column selection switch CSL.

Charges of the memory cells C other than the selected memory cell C are discharged to the discharge circuit 31 after a read process. The discharge circuit 31 is, for example, a transistor connected to the local bit line LB.

Figure 9:
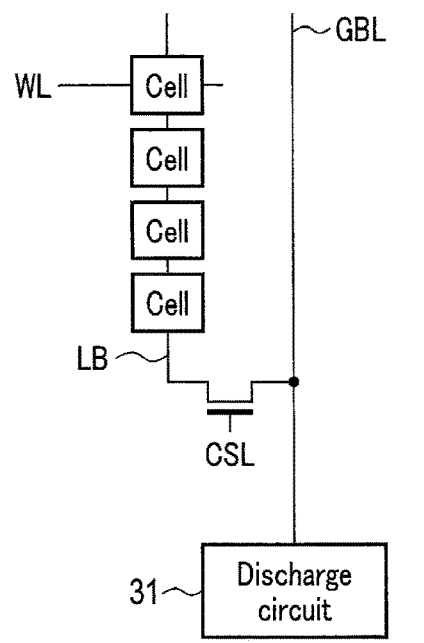
FIG. 9 is a diagram showing an example in which the discharge circuit 31 is connected to the global bit line GBL.

FIG. 9 is a diagram showing an example in which the discharge circuit 31 is connected to the global bit line GBL. After the read process, charges of the memory cells C other than the selected memory cell C are discharged to the discharge circuit 31 connected to the global bit line GBL via the column selection switch CSL.

Figure 10:
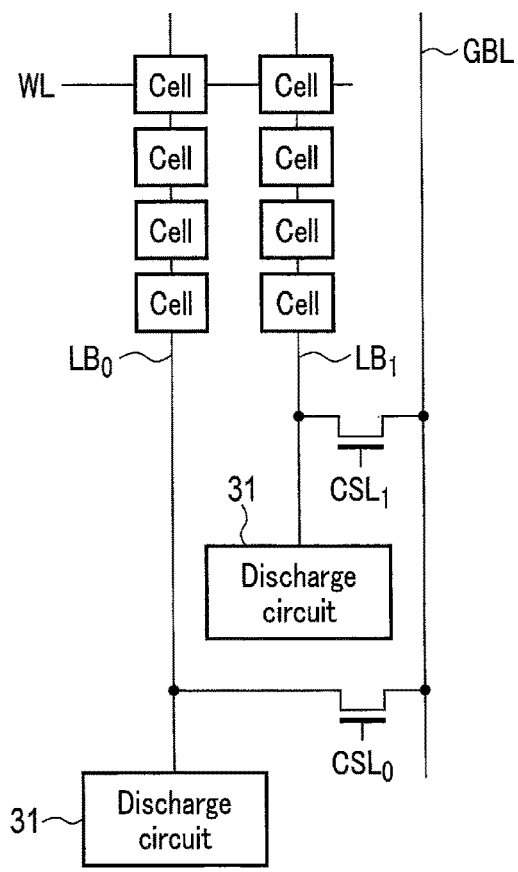
FIG. 10 is a diagram showing an example in which the discharge circuit 31 is connected to each local bit line LB.

FIG. 10 is a diagram showing an example in which the discharge circuits 31 are connected to the respective local bit lines $LB_0$, $LB_1$. The local bit lines $LB_0$, $LB_1$ are connected to the global bit line GBL via the column selection switches $CSL_0$, $CSL_1$ respectively.

Charges of the memory cells C other than the selected memory cell C are discharged to the discharge circuits 31 connected to the respective local bit lines $LB_0$, $LB_1$ after the read process.

FIG. 11 is a diagram showing an example in which the local bit lines $LB_0$, $LB_1$ to which the discharge circuit 31 is connected are collectively connected to the common local bit line $LB_C$ before being connected to the global bit line GBL. The local bit lines $LB_0$, $LB_1$ are connected to the common local bit line $LB_C$ via the column selection switches $CSL_0$, $CSL_1$ respectively. The common local bit line $LB_C$ is connected to the global bit line GBL via the common column selection switch $CSL_C$.

Charges of the memory cells C other than the selected memory cell C are discharged to the discharge circuits 31 connected to the respective local bit lines $LB_0$, $LB_1$ after the read process.

FIG. 12 is a diagram showing an example in which the two discharge circuits 31 shown in FIG. 11 are shared by one discharge circuit 31. That is, instead of the discharge circuits 31 connected to the respective local bit lines $LBLB_0$, $LB_1$, the discharge circuit 31 is connected to the common local bit line $LB_C$.

Charges of the memory cells C other than the selected memory cell C are discharged to the discharge circuit 31 connected to the common local bit line $LB_C$ via the column selection switches $CSL_0$, $CSL_1$ after the read process.

Therefore, according to such a configuration, the area of the mask ROM 51 according to an embodiment can be reduced by sharing the discharge circuit 31.

In an embodiment, the mask ROM has been described as an example of the semiconductor memory device, but it is also possible to apply the read control based on charge sharing according to an embodiment to other semiconductor memory devices such as RAM, SRAM and the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
   a global bit line;
   a local bit line to which a plurality of cell transistors are connected;
   a switch connected to the local bit line;
   signal lines connected to the plurality of cell transistors; and
   a control circuit, wherein
   the control circuit
   selects a cell transistor to be selected by setting a potential of the signal line of the cell transistor to be selected to a first potential,
   sets a potential of the global bit line to a second potential, and
   turns on the switch to connect the local bit line to the global bit line such that the global bit line and the local bit line are charge-shared to have a third potential when the selected cell transistor is an off-cell and to have a fourth potential when the selected cell transistor is an on-cell.

2. The semiconductor memory device according to claim 1, further comprising a reference local bit line, wherein the number of cell transistors connected to the reference local bit line is larger than that of the cell transistors connected to the local bit line.

3. The semiconductor memory device according to claim 1, further comprising a reference local bit line, wherein the number of cell transistors connected to the local bit line is the number of cell transistors in accordance with data to be memorized, and the number of cell transistors connected to the reference bit line is a unique.

4. The semiconductor memory device according to claim 1, wherein the signal line is selected asynchronously with a synchronization signal on which the semiconductor memory device operates.

5. The semiconductor memory device according to claim 1, further comprising a transistor connected to the local bit line or the global bit line to discharge charges of the local bit line.

6. The semiconductor memory device according to claim 2, further comprising a transistor connected to the local bit line or the global bit line to discharge charges of the local bit line.

7. The semiconductor memory device according to claim 3, further comprising a transistor connected to the local bit line or the global bit line to discharge charges of the local bit line.

8. The semiconductor memory device according to claim 1, further comprising a transistor connected to a local bit line different from the local bit line to discharge charges of the local bit line.

9. The semiconductor memory device according to claim 2, further comprising a transistor connected to a local bit line different from the local bit line to discharge charges of the local bit line.

10. The semiconductor memory device according to claim 3, further comprising a transistor connected to a local bit line different from the local bit line to discharge charges of the local bit line.

11. The semiconductor memory device according to claim 1, wherein the control circuit controls the global bit line and the local bit line based on a clock and a control signal supplied from outside.

12. The semiconductor memory device according to claim 1, further comprising a precharge circuit that precharges the global bit line.

13. The semiconductor memory device according to claim 2, further comprising a precharge circuit that precharges the global bit line and the reference local bit line.

14. The semiconductor memory device according to claim 1, wherein the signal line is selected in synchronization with a synchronization signal on which the semiconductor memory device operates.

15. The semiconductor memory device according to claim 1, further comprising:

a reference global bit line;

a reference local bit line to which a plurality of reference cell transistors are connected; and a reference switch connected to the reference local bit line, wherein the control circuit setting a potential of the reference global bit line to a fifth potential, and turns on the reference switch to connect the reference local bit line to the reference global bit line such that the reference global bit line and the reference local bit line are charge-shared to have a sixth potential.

16. The semiconductor memory device according to claim 1, wherein the semiconductor memory device is a read only memory (ROM).

17. A control method of a semiconductor memory device, the semiconductor memory device comprising:

a global bit line;

a local bit line to which a plurality of cell transistors are connected;

a switch connected to the local bit line;

signal lines connected to the plurality of cell transistors; and a control circuit, the method comprising:

by the control circuit, selecting a cell transistor to be selected by setting a potential of the signal line of the cell transistor to be selected to a first potential;

setting a potential of the global bit line to a second potential; and turning on the switch to connect the local bit line to the global bit line such that the global bit line and the local bit line are charge-shared to have a third potential when the selected cell transistor is an off-cell and to have a fourth potential when the selected cell transistor is an on-cell.

18. The control method of a semiconductor memory device according to claim 17, the semiconductor memory device further comprising:

a reference global bit line;

a reference local bit line to which a plurality of reference cell transistors can be connected; and a reference switch connected to the reference local bit line, the method comprising:

setting a potential of the reference global bit line to a fifth potential; and turning on the reference switch to connect the reference local bit line to the reference global bit line.

19. The control method of a semiconductor memory device according to claim 17, wherein the semiconductor memory device is a read only memory (ROM).

* * * * *